United States Patent [19]

Filipiak et al.

[11] Patent Number: 6,054,377
[45] Date of Patent: Apr. 25, 2000

[54] METHOD FOR FORMING AN INLAID VIA IN A SEMICONDUCTOR DEVICE

[75] Inventors: Stanley M. Filipiak, Pflugerville; John C. Arnold; Phillip Crabtree, both of Austin, all of Tex.

[73] Assignee: Motorola, Inc., Schaumburg, Ill.

[21] Appl. No.: 08/858,109

[22] Filed: May 19, 1997

[51] Int. Cl.⁷ .................................................. H01L 21/441
[52] U.S. Cl. .......................... 438/619; 438/624; 438/638; 438/700
[58] Field of Search .................................... 438/619, 637, 438/638, 624, 634, 700; 257/774

[56] References Cited

U.S. PATENT DOCUMENTS

| | | | |
|---|---|---|---|
| 5,171,713 | 12/1992 | Matthews | 437/189 |
| 5,324,683 | 6/1994 | Fitch et al. | 437/65 |
| 5,534,462 | 7/1996 | Fiordalice et al. | 438/190 |
| 5,641,711 | 6/1997 | Cho | 438/763 |
| 5,741,626 | 4/1998 | Jain et al. | 430/341 |
| 5,808,353 | 9/1998 | Fuller et al. | 257/651 |
| 5,814,555 | 9/1998 | Bandyopadhyay et al. | 438/619 |
| 5,837,618 | 11/1998 | Avanzino et al. | 438/778 |
| 5,863,832 | 1/1999 | Doyle et al. | 438/622 |
| 5,880,018 | 3/1999 | Boeck et al. | 438/619 |

*Primary Examiner*—Wael Fahmy
*Assistant Examiner*—Kurt Eaton

[57] ABSTRACT

A inlaid interconnect is formed in a semiconductor device (30). A first interlayer dielectric (ILD) 40 is deposited and etched to form a via opening (44). An etchstop layer (42) is deposited on ILD (40). A second ILD (45) is deposited on etchstop layer (42) in a manner so that a pinch-off region (46) is formed to prevent substantial deposition of the ILD material into via opening (44). While a small deposit (47) of ILD material may form within the via opening, this can be easily removed in a subsequent etch of ILD (45) which forms a trench opening (48) in ILD (45). A metal layer (50) is then deposited and polished to form a metal interconnect having a trench portion (52) and a via portion (54) in device (30). The present invention avoids the need for a substantial over-etch to clear the via, and avoids the need to form a thick resist mask to form the via opening, while maintaining a controlled via diameter.

20 Claims, 3 Drawing Sheets

METHOD FOR FORMING AN INLAID VIA IN A SEMICONDUCTOR DEVICE

CROSS-REFERENCE TO RELATED APPLICATION

The present application is related to the following U.S. patent applications: "A Method for Manufacturing a Low Dielectric Constant Inter-Level Integrated Circuit Structure", invented by Bruce Boeck, et al, having application Ser. No. 08/727,159, filed Oct. 7, 1996, and assigned to the assignee hereof.

FIELD OF THE INVENTION

The present invention relates generally to semiconductor fabrication processes, and more particularly to manufacturing processes which utilize inlaid metal interconnects.

BACKGROUND OF THE INVENTION

Inlaid metal interconnect processes for semiconductor manufacturing are replacing conventional blanket metal deposition and etch processes. Traditionally, a blanket metal film has been deposited and patterned using photolithographic techniques to form a patterned metal interconnect. As metal geometries decrease and as metal lines are formed closer and closer together, it becomes more difficult to accurately pattern the metal lines and form the metal interconnects using a traditional blanket deposition and patterning process. Inlaid metal interconnect processes have been developed to overcome some of these problems. In an inlaid metal interconnect process, an interlayer dielectric (ILD) metal is deposited, and a via or opening is formed in this dielectric layer. A blanket layer of metal is then deposited across the device, including in the via. The blanket metal layer is then polished back, leaving metal only in the via area.

A dual inlaid interconnect process is an improvement over the single inlaid process in that both the metal via and the metal interconnect can be formed with the same metal deposition step. In a typical dual inlaid process, a first ILD material is deposited. A thin etchstop layer is deposited on this first ILD. A second ILD material is then deposited on the etchstop layer. Within this dielectric stack, both a via opening and a trench opening are formed, wherein the via opening is used to interconnect one metal layer to another, while the trench opening is used to form the metal interconnect.

There are at least three known processes for forming the openings in the ILD stacks in dual inlaid applications. In a first process, the intervening etchstop layer is patterned to form an opening in the etchstop which corresponds to the via opening. After forming the second or upper most ILD, a resist mask is deposited and patterned to match a pattern of the trenches. The ILD is then etched with the resist mask in place to form the trench, and a long overetch is performed to etch the underlying or first ILD using the patterned etchstop layer as an etch mask. However, a problem with this approach is that the extent of overetch necessary to clear the via often erodes the etchstop material around the vias and results in blown out vias. In an extreme case, adjacent vias may be eroded to the extend that they short together. Accordingly, the process is not suited for tight geometries.

A second known process for patterning the ILD stacks in a dual inlaid application is to form the via first and the trench or channel last. In such a process, the first or lower ILD layer, the etchstop layer, and the upper or second ILD layer are sequentially deposited. A resist mask is deposited on the device and patterned to match the via pattern. A via etch is then performed which etches the upper or second ILD layer and the etchstop layer and the lower or first ILD layer all within the same etch step. (The etch chemistry may or may not be changed to etch the etchstop layer in forming the via). Following the via etch, the first resist mask is removed, and a second resist mask is deposited and patterned to match the trench pattern. A second etch is performed to remove the upper most ILD layer to form the trench, wherein the etch is performed selectively to the etchstop layer. Because there is no need to perform an overetch to clear the oxide in the via portion in the first or lower most ILD layer, erosion of the etchstop around the via is minimized. However, a problem in forming the via first is that the aspect ratio (wherein the via is formed through the upper most ILD, the etchstop, and the lower most ILD) that will be created makes the via/trench etch very difficult. Accordingly, this process is not very scaleable as via dimensions become smaller. Furthermore, this process sequence often leaves a residue of the ILD material in the via, resulting in poor contact reliability.

The third known process for forming the dual inlaid structure involves forming the trench first and the via last. Again, in this process, the full dielectric stack is formed through sequential depositions of the first ILD layer, the etchstop layer, and the second ILD layer. A resist mask is then deposited and patterned according to the trench pattern. The upper most ILD layer is then etched using this resist mask to form the trenches. The resist mask is then removed, and a second resist mask is formed on the device, wherein the second resist mask is deposited and patterned to define the via pattern. After the second resist mask is patterned, the etchstop layer and the first ILD layer are etched with the second resist mask in place to form the vias. While in forming the trench first, a long overetch of either of the ILDs is avoided, and the aspect ratio of the via etch is reduced in comparison to forming the via first, it is very difficult to deposit and pattern the second resist mask. Because the second resist mask is defining the via pattern, this resist mask must be deposited into the trench openings formed in the second ILD layer. Accordingly, the resist will be unusually thick within the trench portion of the second ILD layer. It is difficult to accurately pattern such a thick mask with existing photolithographic equipment due to the limitations on the depth of focus.

Accordingly, there is a need in the semiconductor industry for a method to form a dielectric material and corresponding openings therein for inlaid metal applications which overcome the problems mentioned above. Furthermore, it would be desirable if such a method could be implemented with adding minimal processing steps and which can be easily integrated into a manufacturer's existing process.

DETAILED DESCRIPTION OF A PREFERRED EMBODIMENT

Figure 1:
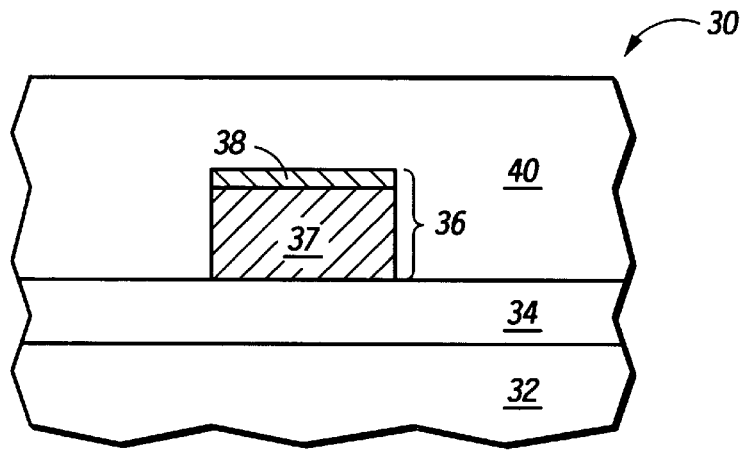
FIGS. 1–7 illustrate in sequential cross-sectional views a portion of a semiconductor device as it is made in accordance with one embodiment of the present invention to form a dual inlaid metal interconnect.

Generally, the present invention provides a method for forming a dielectric layer in a semiconductor device for use in an inlaid interconnect structure. In accordance with one embodiment of the present invention, a via or opening is formed in an ILD of a semiconductor device. Another ILD material is deposited over the device without filling the via opening in the first ILD layer. In a preferred embodiment, the second ILD material is deposited in a manner so that the second ILD pinches off at the via location, thereby preventing deposition of the second ILD material into the via. A resist mask is then deposited and patterned to correspond to an interconnect trench pattern for the device. The second ILD layer is then etched with the resist mask in place to form the trenches. Because there is little to no deposition of the second ILD material into the via opening, only a minimal amount of overetch is necessary to clear the via to maintain adequate contact to an underlying conductive member. By minimizing the overetch, the size of the via is maintained as originally defined. Furthermore, the via is defined first so that a high aspect ratio etch through two dielectric materials is not necessary as compared to the prior art via first process. Nor is there a need to deposit a photoresist layer into an already defined trench as in a prior art trench first method. Accordingly, the present invention enables the formation of vias and trench openings in ILDs while overcoming many of the problems associated with the prior art methods.

These and other features and advantages of the present invention will be more clearly understood from the following detailed description taken in conjunction with the accompanying drawings. It is important to point out that the illustrations are not necessarily drawn to scale, and that there are likely to be other embodiments of the present invention which are not specifically illustrated. Further, it is noted that like reference numerals are sometimes used throughout the various views to denote identical or similar elements.

FIGS. 1–7 illustrate in cross-sectional views a portion of a semiconductor device 30 as it undergoes processing steps in accordance with the present invention to form an inlaid metal interconnect. It is noted, that while the present invention is specifically described with reference to a dual inlaid metal interconnect process, that the invention is applicable to all types of inlaid processing, including the formation of inlaid conductive members as well as inlaid insulative members.

FIG. 1 illustrates an initial structure suitable for describing and referencing the present invention as it relates to a semiconductor manufacturing operation. As shown, semiconductor device 30 includes a semiconductor substrate 32 having an overlying dielectric layer 34 and a metal interconnect 36. In semiconductor devices such as integrated circuits, substrate 32 will generally be a single crystal silicon wafer, but can instead be a silicon-on-insulator (SOI) substrate, a silicon-on-sapphire (SOS) substrate, a gallium arsenide substrate, or the like. Dielectric layer 34 may be a thermally grown silicon dioxide, a doped or undoped deposited silicon dioxide, silicon nitride, oxynitride, or other conventional dielectric material used in semiconductor manufacturing. Dielectric layer 34 serves to electrically isolate metal interconnect 36 in areas where such electrical isolation is desired. It is noted that in other areas of device 30, it is possible that metal interconnect 36 has direct contact to to a portion of substrate 32, for example when making contact to a source or drain region of a transistor.

As illustrated, metal interconnect 36 includes a primary portion 37 and a capping portion 38. In a preferred embodiment, primary portion 37 is formed of aluminum, or an aluminum alloyed with small amounts of copper and/or silicon. Other interconnect metals can be used in place of aluminum. For example, much work is being done to replace conventional aluminum interconnects with copper interconnect metals. Capping portion 38 in one embodiment is an antireflective coating (ARC) in the form of a titanium nitride (TiN) film. Other ARC materials can used to be tailored to the wavelength being used in the photolithographic operations. In the embodiment illustrated, metal interconnect 36 is the conductive member to which a subsequently deposited metal layer is to be connected. In other words, metal interconnect 36 would be part of a first or lower metal layer in a semiconductor device to which a second or upper metal layer must be connected through a series of vias. In other embodiments of the present invention, the upper metal layer could be connected to a variety of other conductive members rather than a metal interconnect 36. For example, a metal layer could be connected to a polysilicon member, or to a doped region within a silicon substrate. Accordingly, the present invention is not limited to having a metal layer being connected to metal interconnect 36.

As shown in FIG. 1, metal interconnect is formed directly on dielectric layer 34; however, one will appreciate that there can be numerous intervening layers between the interconnect and underlying substrate 32. For example, doped regions, silicide regions, polysilicon layers, isolation regions, epitaxial layers, and various dielectric layers or spacers used to form active devices, such as transistors, are likely to be present. However, for the purposes of understanding the present invention, an understanding of these intervening layers is not necessary and will not be discussed or illustrated further.

Continuing with the initial device structure illustrated in FIG. 1, a first interlayer dielectric (ILD) 40 overlies interconnect 36. ILD 40 will generally be a silicon-based dielectric, such as tetra-ethyl-ortho-silicate (TEOS), spin-on-glass (SOG), a plasma enhanced oxide, a doped silicate glass such as a boron phosophorous doped silicate glass (BPSG). Polymer materials are also suitable as an ILD layer. ILD 40 is deposited using conventional ILD deposition techniques, such as chemical vapor deposition (CVD), or spin-on deposition. The thickness of ILD 40 should be chosen such that a via can be etched through the dielectric material over interconnect 36 and that a conductive material can be successfully deposited in such via opening.

Figure 2:
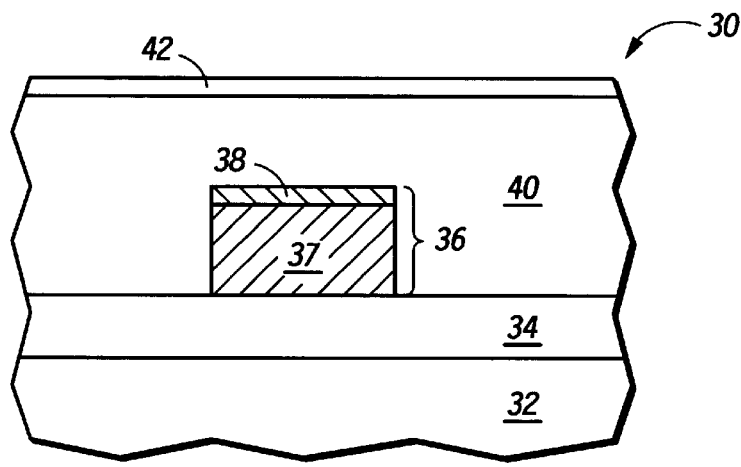

As illustrated in FIG. 2, a next step in accordance with a preferred embodiment of the present invention is the deposition of an etchstop layer 42. Etchstop layer 42 is preferably a plasma enhanced silicon nitride layer, but instead could be any material which has the ability to serve as an etchstop in removing the second or uppermost ILD layer as will subsequently be described. The thickness of etchstop layer is not particularly important, but should be chosen so that it is thick enough to withstand the etch of the second ILD layer while maintaining integrity.

Figure 3:
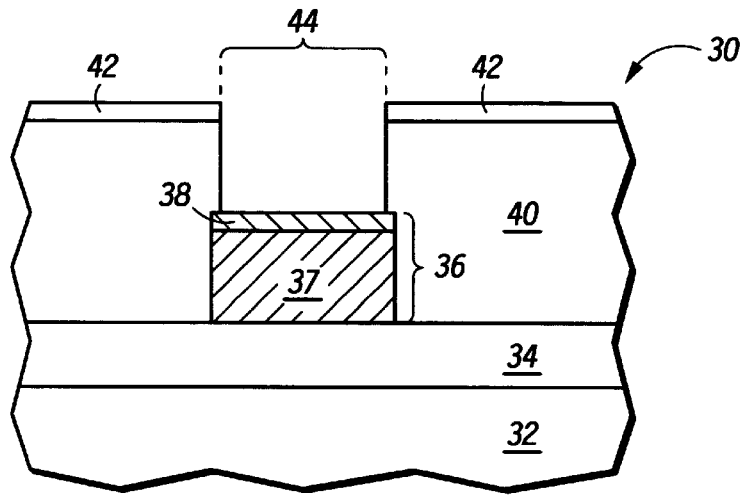

After depositing etchstop layer 42, device 30 is patterned and etched to form a contact or via opening 44 through etchstop layer 42 and into ILD 40, as shown in FIG. 3. Via opening 44 exposes a portion of interconnect 36, namely that portion of the interconnect which is to be contacted by a subsequently deposited metal layer. To form opening 44, conventional photolithographic techniques are used to form a resist mask (not shown) which defines where the opening is to be formed. The device then undergoes a dry etch to remove the dielectric materials over the interconnect to form via opening 44. Both the etchstop layer 42 and ILD 40 can be etched with a single fluorine-based dry etch chemistry. Because the etchstop layer can be made thin, a single etch chemistry can be used. Alternatively, different etch chemistries can be used to remove etchstop layer 42 and ILD 40.

Figure 4:
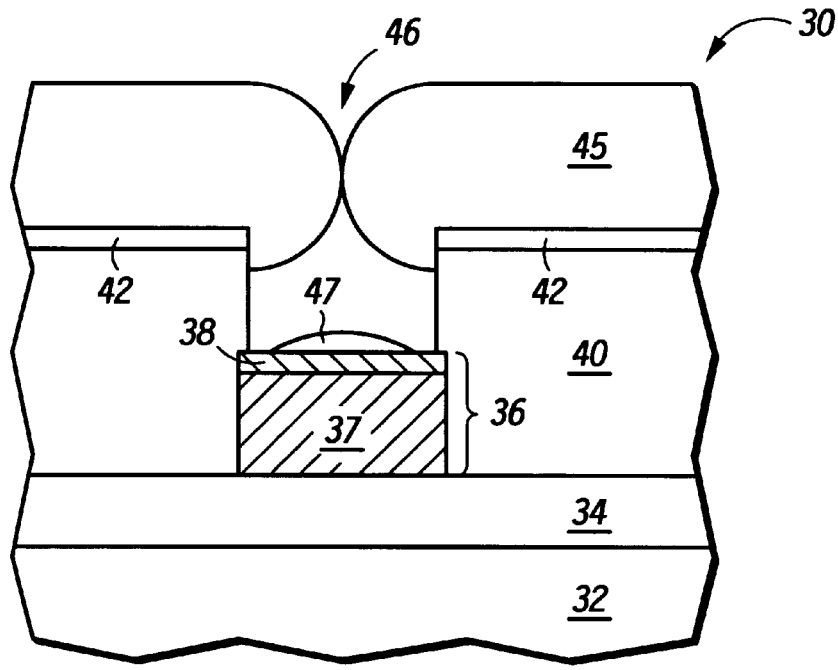

Once via opening 44 is formed, a second ILD 45 is deposited over semiconductor device 30 as shown in FIG. 4.

ILD 45 will serve as the uppermost ILD layer of the ILD stack which separates the first metal layer from the second metal layer in the embodiment illustrated. In accordance with an embodiment of the present invention, ILD 45 is deposited such that a pinch-off region 46 is formed over via opening 44. In other words, the lateral growth of the material being deposited to form ILD 45 is fast enough such that a cusp is formed during deposition at the edges of via opening 44. As deposition continues, this cusp grows and eventually creates region 45 where the two encroaching edges of ILD 45 meet. As shown in FIG. 4, a small deposit 47 of the material used to form ILD 45 may be formed within via opening 44 on interconnect 36 prior to a full pinch-off of ILD 45. In other words, prior to the formation of a full pinch-off, deposition of the ILD material may occur within the via. While in the embodiment illustrated the intent is to not fill the via opening with the material of ILD 45, it is recognized that complete prevention may be difficult to obtain if the aspect ratio of via opening 44 is sufficiently low. However, when the aspect ratio of via opening 44 is high, a deposition of a material to form ILD 45 can be achieved without formation of small deposit 47. The presence of small deposit 47 is not detrimental to practicing the invention, and can be handled in a subsequent etch step.

In a preferred embodiment, ILD 45 is formed of an oxide-based dielectric material, for example a plasma enhanced phosphosilicate glass (PEPSG) is used. A PEPSG layer can be deposited in a chemical vapor deposition apparatus in the presence of a plasma. The chemistry within the deposition chamber is formed by flowing silane ($SiH_4$), nitrous oxide ($N_2O$), phosphine ($PH_3$) and nitrogen ($N_2$). To form the re-entrant profile of ILD 45 as illustrated in FIG. 4, the process parameters of the deposition can be as follows: flow rate of $SiH_4$ of 50–200 standard cubic centimeters per minute (sccm); flow rate of $N_2O$ of 1200–2300 (sccm); flow rate of a mixture of 95% $N_2$ and 5% $PH_3$ of 250–450 (sccm); chamber pressure of 2.7–3.7 Torr; a substrate or wafer holder temperature of 350°–425° C.; a power of 400–800 watts to generate the plasma; and a spacing between the semiconductor substrate and the upper electrode within the chamber of 480–570 mils. Using a deposition process within the process parameters mentioned above, a 16,000 angstrom PEPSG film was deposited over semiconductor substrate having 0.5 micron vias formed in an underlying ILD layer, without any noticeable deposition of the PEPSG film within the via. While a PEPSG film has been shown to be suitable for practicing the present invention, it is anticipated that other materials can be deposited in a manner to form a pinch-off region 46 as illustrated in FIG. 4 to prevent substantial deposition of the material within the via opening in accordance of the present invention.

Figure 5:
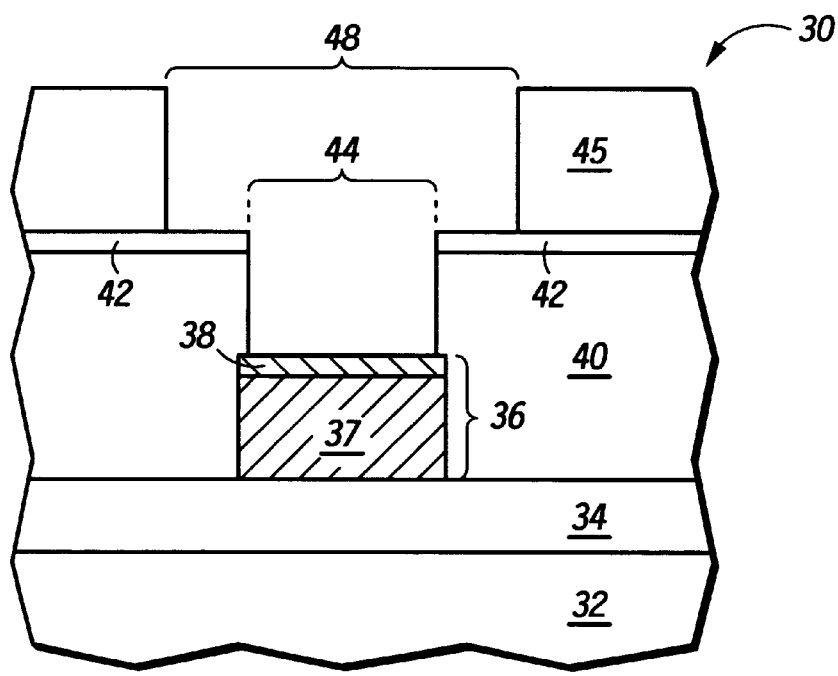

After forming ILD 45. Semiconductor device 30 is patterned to form trenches in ILD 45 as illustrated in FIG. 5. Using conventional lithographic techniques, a resist mask (not shown) is deposited over device 30 and is patterned to correspond to the pattern of trench opening within the device. With the resist mask in place, ILD layer 45 is etched to form a trench opening 48 as illustrated. The etch is performed using a fluorine-based chemistry which is selective to etchstop layer 42. In order to assure that any small deposit 47 is likewise removed from within opening 44, a small degree of overetch can be performed to assure via opening 44 is cleaned to expose interconnect 36 within the via opening.

Figure 6:
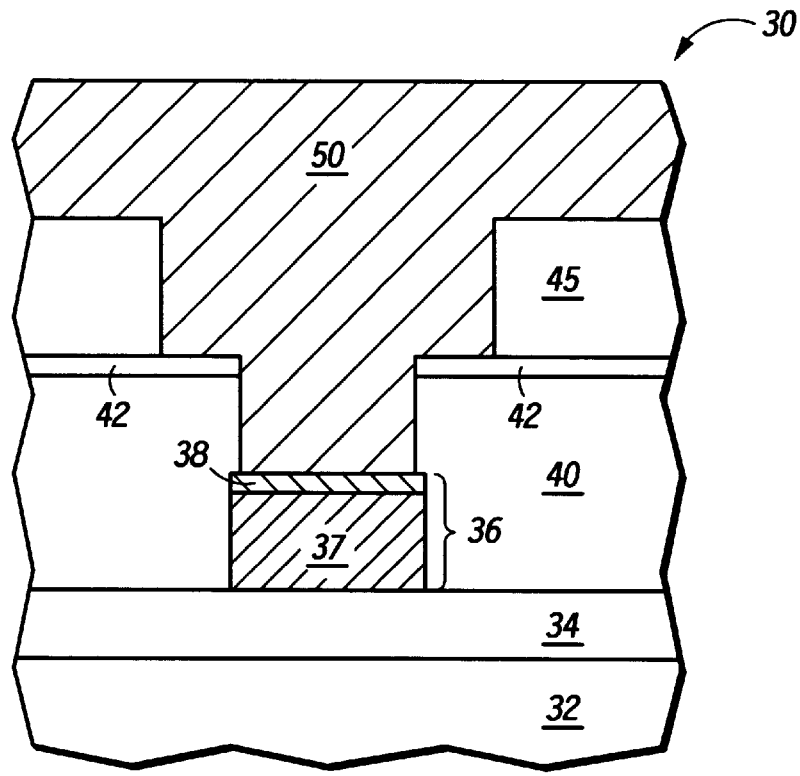
Figure 7:
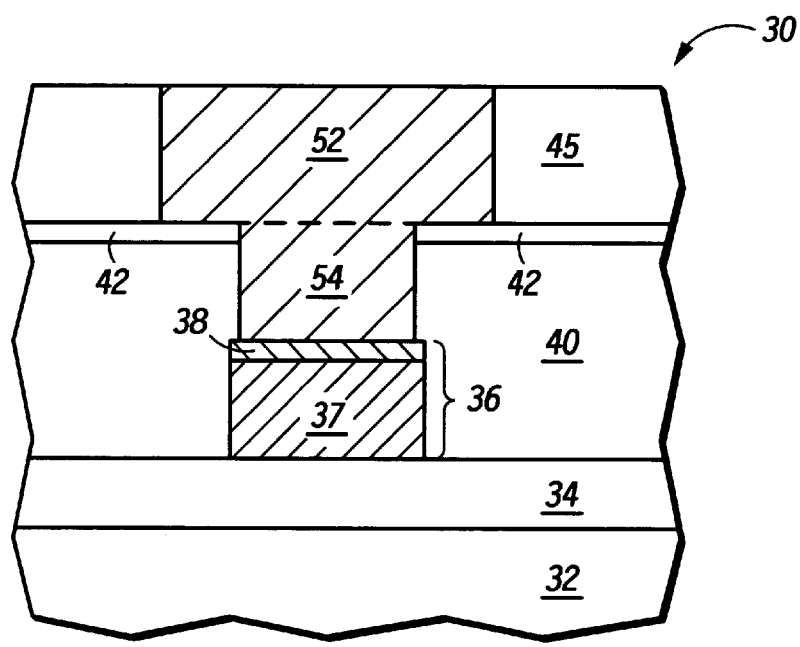

Following formation of trench opening 48, a metal layer 50 is deposited over device 30 as illustrated in FIG. 6. In a preferred embodiment of the invention, metal layer 50 is again an aluminum layer which is alloyed with small amounts of copper and/or silicon. Alternatively, metal layer 50 can be copper or other conducting material. In depositing metal layer 50, both via opening 44 and trench opening 48 are filled with the metal material. To form the inlaid interconnect and electrically isolate adjacent interconnects, excessive metal material overlying ILD 45 is removed, for example, by a polishing operation as shown in FIG. 7. Conventional chemical mechanical polishing (CMP) techniques can be utilized in removing metal layer 50 from areas overlying ILD 45. The resulting interconnect structure will have a trench portion 52 and a via portion 54 as depicted in FIG. 7.

The foregoing description and illustrations contained herein demonstrate many of the advantages associated with the present invention. In particular it has been revealed that a dielectric layer can be deposited and etched for inlaid metal applications without the need to perform a large degree of overetch to clear the via opening. Accordingly, the size of the resulting via can be tightly controlled and maintained to the originally defined size. While two etches are still necessary in practicing the present invention in a dual inlaid application, these etch steps are simpler and more easily controlled than the etches used in prior art dual inlaid processes. With the present invention, the via can be etched without having to etch a high aspect ratio region, since the via is etched prior to formation of the second ILD layer. Accordingly, a highly selective etch to form the vias is not required. Nor is it required that a resist mask be formed within a trench portion of the dielectric or that the resist mask is undesirably thick. In addition, the present invention is quite scalable. As the dimensions of vias and metal interconnects shrink, the present invention be comes even more attractive due to the fact that pinch-off of the second ILD layer will occur more quickly. Furthermore, in practicing the invention no additional processing steps are required beyond those currently being practiced in inlaid interconnect applications. In using a PEPSG film in conjunction with the invention, the deposition rate of PEPSG is faster than conventional TEOS depositions, and therefor a higher throughput is achievable. Also, by making the first ILD layer and the second ILD layer of the same material, such as PEPSG, a single deposition apparatus can be used for floor space savings. Finally, in the using of PEPSG film as the second ILD layer, the benefits of phosphorous as a gettering agent for ionic contaminants can be obtained.

Thus it is apparent that there has been provided in accordance with the invention a method for forming an inlaid interconnect in a semiconductor device that fully meets the needs and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, the same beneficial results as with the embodiment herein described can be achieved by filling the via opening with a sacrificial material before depositing the upper ILD material, where the sacrificial material is preferably more easily removed from the via opening than the ILD material. The sacrificial material, like a pinch-off region, blocks deposition of the ILD material into the via opening and can be removed after or during the trench etch. Therefore it is intended that the invention encompass all such variations and modifications as filed within the scope of the appended claims.

We claim:

1. A method for making a semiconductor device, comprising the steps of:
   providing a semiconductor substrate having an overlying layer with a first opening which exposes a portion of the semiconductor substrate;
   chemically vapor depositing a film over the overlying layer without filling the first opening, wherein at least a portion of the film is deposited in a bottom of the first opening;
   removing a portion of the film from overtop of the first opening and the at least a portion of the film from the bottom of the first opening; and
   forming a second opening through the film, the second opening overlapping the first opening.

2. A method as in claim 1, further comprising the step of: depositing a third layer in the first and second openings.

3. A method as in claim 2, wherein the third layer is a conductive layer.

4. A method as in claim 3, wherein the first opening forms a via and the second opening forms a trench.

5. A method as in claim 1, further comprising the step of filling the first opening with a first material, and wherein the step of forming a second opening comprises the step of removing the first material from the first opening.

6. A method as in claim 1, wherein the step of depositing the film comprises the steps of:
   flowing a silane gas over the semiconductor substrate, the silane gas having a flow rate between 50 and 200 standard cubic centimeters per minute; and
   applying radio frequency (RF) power between 400 and 800 watts to form a plasma.

7. A method as in claim 6, wherein the step of depositing the film comprises flowing a gas mixture comprised of silane, nitrogen, nitrous oxide, and phosphine over the semiconductor substrate in presence of a plasma.

8. A method as in claim 1, wherein the step of depositing the film comprises depositing the film such that the film laterally spans the first opening prior to completing the step of depositing to prevent any additional deposition into the first opening.

9. A method as in claim 1, wherein the overlying layer and the film are formed of a same dielectric material.

10. A method for making a semiconductor device, comprising the steps of:
    providing a semiconductor substrate;
    depositing a first layer over the semiconductor substrate;
    depositing an etch-stop layer over the first layer;
    forming a first opening through the etch-stop layer and the first layer to the substrate;
    depositing a second layer over the etch-stop layer, the second layer not filling the first opening, wherein a portion of the second layer is deposited on a bottom of the first opening;
    removing a portion of the second layer from overtop of the first opening and the portion of the second layer from the bottom of the first opening;
    forming a second opening through the second layer, the second opening overlapping the first opening; and
    depositing a third layer in the first and second openings.

11. A method as in claim 10, wherein the first and second layers are interlevel dielectric layers.

12. A method as in claim 10, wherein the third layer is a conductive layer.

13. A method as in claim 10, wherein the step of depositing the second layer comprises the step of:
    forming a span over the first opening.

14. A method as in claim 10, wherein the step of depositing the second layer comprises the step of:
    flowing a silane gas over the semiconductor substrate, the silane gas having a flow rate between 50 and 200 standard cubic centimeters per minute; and
    applying radio frequency (RF) power between 400 and 800 watts to form a plasma.

15. A method for making a semiconductor device comprising the steps of:
    providing a semiconductor substrate having a first dielectric layer and an etch stop layer with a via opening formed therein, the via opening having an edge;
    chemically vapor depositing a second dielectric layer over the first dielectric layer such that during deposition a portion of the second dielectric layer extends laterally over the edge of the via opening thereby blocking subsequent deposition of material into the via openings, wherein at least a portion of the second dielectric layer is deposited in a bottom of the via;
    removing the portion of the second dielectric layer from over the edge of the via opening and the at least a portion of the second dielectric layer from the bottom of the via; and
    depositing a conductive material into the via openings.

16. The method of claim 15, further comprising the step of depositing an etchstop layer between the first and second dielectric layers.

17. The method of claim 15, wherein the second dielectric layer comprises a silicate glass doped with phosphorous.

18. The method of claim 17, wherein the silicate glass is deposited by plasma enhanced deposition.

19. The method of claim 15, wherein the step of removing comprises forming an interconnect trench.

20. The method of claim 19, wherein the step of depositing a conductive material comprises depositing metal into the via opening and interconnect trench.

* * * * *